United States Patent
Eum

[11] Patent Number: 6,114,881
[45] Date of Patent: Sep. 5, 2000

[54] CURRENT MIRROR TYPE SENSE AMPLIFIER

[75] Inventor: In Hwan Eum, Kyoungki-do, Rep. of Korea

[73] Assignee: Hyundai Electronics Industries Co., Ltd., Ichon-shi, Rep. of Korea

[21] Appl. No.: 09/102,354

[22] Filed: Jun. 23, 1998

[30] Foreign Application Priority Data

Jun. 24, 1997 [KR] Rep. of Korea ...................... 97-26977

[51] Int. Cl.[7] ................................. H03K 3/02; G11C 7/06
[52] U.S. Cl. ............................ 327/53; 327/179; 365/203; 365/208
[58] Field of Search ................................. 327/51, 52, 53, 327/178, 179, 309; 365/190, 203, 207, 208

[56] References Cited

U.S. PATENT DOCUMENTS

| | | | |
|---|---|---|---|
| 4,811,295 | 3/1989 | Shinoda | 365/189.05 |
| 5,389,841 | 2/1995 | Agata et al. | 327/434 |
| 5,450,361 | 9/1995 | Iwahashi et al. | 365/200 |
| 5,872,465 | 2/1999 | Saitoh | 327/51 |
| 5,886,936 | 3/1999 | Yang | 365/203 |
| 5,920,208 | 7/1999 | Park | 327/54 |

*Primary Examiner*—Timothy P. Callahan
*Assistant Examiner*—Terry L. Englund
*Attorney, Agent, or Firm*—Jacobson, Price, Holman & Stern, PLLC

[57] ABSTRACT

A current mirror type sense amplifier can prevent the lowering of gain when the input signal and the inverted input signal are swung around the power voltage level, and also stably performs the sensing & amplifying operation in wide range from low power voltage to high power voltage. The sense amplifier includes first and second current mirror type sense amplifying units for primarily sensing and amplifying the voltage differences between an input signal and an inverted input signal and vice versa, respectively, in response to a first sense enable signal; a third current mirror type sense amplifying unit for sensing and amplifying the voltage difference between output signals of the first and the second current mirror type sense amplifying units in response to a second sense enable signal; a first precharging unit for precharging output nodes of the first and the second current mirror type sense amplifying units, respectively, in response to the first sense enable signal; and a second precharging unit for precharging an output node of the third current mirror type sense amplifying unit, in response to the second sense enable signal.

13 Claims, 6 Drawing Sheets

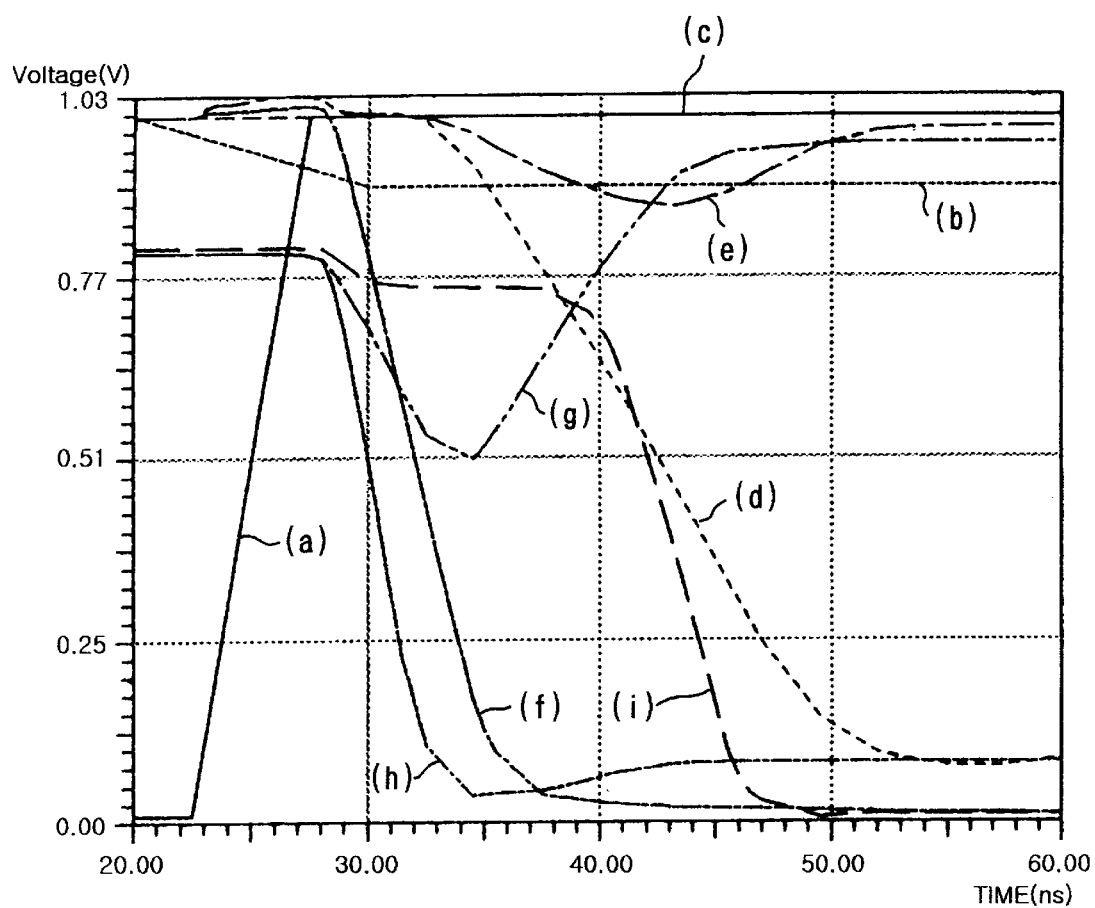

CURRENT MIRROR TYPE SENSE AMPLIFIER

BACKGROUND OF THE INVENTION

The present invention relates to a sense amplifier, more particularly to a current mirror type sense amplifier which is capable of effectively performing its operation in wide range of power voltage level between low power voltage level and high power voltage level.

Generally, a sense amplifier senses the minute voltage difference between two input nodes and amplifies the voltage difference to produce it. The same voltages being applied to two input nodes of sense amplifier can not cause any change in output of the sense amplifier, since there is no voltage difference therebetween.

Accordingly, if a pair of signal lines having the same electrical environment are used as inputs of the sense amplifier, electrical noise commonly induced to the signal line can not affect its output and only the difference signal can be amplified. As the sense amplifier, there are included a current mirror type sense amplifier whose input and output nodes are separated, a cross-couple type sense amplifier whose input and output nodes are common, and etc.

Here, the current mirror type sense amplifier can speedily sense & amplify the minute voltage difference between the two input nodes but the swing depth of its output signal is limited. Thus, the current mirror type sense amplifier is suitable for low voltage and speedy transfer.

FIG. 1 is a circuit diagram of a conventional sense amplifier which is composed of a first, a second and a third current mirror type sense amplifying units 10, 20 and 30.

Referring to FIG. 1, the first current mirror type sense amplifying unit 10 is composed of NMOS transistors NM11, NM12 and NM13, and PMOS transistors PM11 and PM12. The NMOS transistors NM11 and NM12 are for sensing and amplifying and are applied with an input signal BL and an inverted input signal /BL, respectively, through their respective gates. The PMOS transistors PM11 and PM12 serve as a current mirror and the source-drain paths thereof are coupled between the power voltage and the drains of the NMOS transistors NM11 and NM12, respectively. The NMOS transistor NM13 serves as a current source and is applied with a first sense enable signal SE1 through its gate. The drain-source path of the NMOS transistor NM13 is coupled between the common sources of the NMOS transistors NM11 and NM12 and ground. The output signal SAO of the first current mirror type sense amplifying unit 10 is produced from the common drain node of the PMOS transistor PM12 and the NMOS transistor NM12.

Similarly, the second current mirror type sense amplifying unit 20 is composed of NMOS transistors NM22 and NM21, PMOS transistors PM22 and PM21, and an NMOS transistor NM23. The NMOS transistors NM22 and NM21 serve with sensing and amplifying and are applied with the inverted input signal /BL and the input signal BL, respectively, through their respective gates. The PMOS transistors PM22 and PM21 serve as a current mirror and the source-drain paths thereof are coupled between the power voltage and the drains of the NMOS transistors NM22 and NM21, respectively. The NMOS transistor NM23 serves as a current source and is applied with the first sense enable signal SE1 through its gate. The drain-source path of the NMOS transistor NM23 is coupled between the common sources of the NMOS transistors NM22 and NM21 and the ground. The output signal SAOB of the second current mirror type sense amplifying unit 20 is produced from the common drain of the NMOS transistor NM21 and the PMOS transistor PM21.

In addition, the third current mirror type sense amplifying unit 30 is composed of NMOS transistors NM31 and NM32, PMOS transistors PM31 and PM32, and NMOS transistor NM33. The NMOS transistors NM31 and NM32 serve with sensing and amplifying and are applied with the output signal SAO of the first current mirror type sense amplifying unit 10 and the output signal SAOB of the second mirror type sense amplifying unit 20, respectively, through their respective gates. The PMOS transistors PM31 and PM32 serve as a current mirror and the source-drain paths thereof are coupled between the power voltage and the drains of the NMOS transistors NM31 and NM32, respectively. The NMOS transistor NM33 serves as a current source and is applied with a second sense enable signal SE2 through its gate. The drain-source path of the NMOS transistor NM33 is coupled between the common sources of the NMOS transistors NM31 and NM32 and the ground. The output signal OUT of the third current mirror type sense amplifying unit 30 is produced from the common drain of the NMOS transistor NM32 and the PMOS transistor PM32. Here, the second sense enable signal SE2 is activated after the first and the second current mirror type sense amplifying unit 10 and 20 is fully sensed and amplified in response to the first sense enable signal SE1.

The operation of the conventional current mirror type sense amplifier as described above, will be briefly explained.

First of all, the first and the second current mirror type sense amplifying unit 10 and 20 are activated by the first sense enable signal SE1 to primarily sense and amplify the difference between the input signal BL and the inverted input signal /BL. Then, the third current mirror type sense amplifying unit 30 is activated by the second enable signal SE2 to secondly sense and amplify the difference between the output signals SAO and SAOB of the first and the second current mirror type amplifying unit 10 and 20 and then finally produce the output signal OUT.

However, there are problems in the conventional current mirror type sense amplifier as above, that the first and the second current mirror type sense amplifying units can not sense the variation at the input nodes because the input signal and the inverted input signal have the voltage levels around the power voltage due to lowering the power voltage of a semiconductor memory device, and that the gain of the amplifying units are reduced to thereby possibly produce an error data due to noise.

SUMMARY OF THE INVENTION

Accordingly, the object of the present invention is to provide a current mirror type sense amplifier which can solve the above problems, and which can prevent the lowering the gain thereof when the input signal and the inverted input signal are swung around the power voltage, and which can also stably sense and amplify in a wide range between high power voltage and low power voltage.

To accomplish the above object of the present invention, there is provided with a current mirror type sense amplifier comprising a first and a second current mirror type sense amplifying unit for primarily sensing and amplifying the voltage differences between an input signal and an inverted input signal and vice versa, respectively, in response to a first sense enable signal; a third current mirror type sense amplifying unit for sensing and amplifying the voltage difference between output signals of the first and the second current mirror type sense amplifying units in response to a second sense enable signal; a first precharging unit for precharging output nodes of the first and the second current mirror type sense amplifying units, respectively, in response to the first sense enable signal; and a second precharging unit for precharging an output node of the third current mirror type sense amplifying unit, in response to the second sense enable signal.

BRIEF DESCRIPTION OF THE DRAWINGS

For a more complete understanding of the present invention and the advantage thereof, reference is now made to the following description taken in conjunction with the accompanying drawings in which:

FIGS. 3A–3D illustrate the operation characteristics of the current mirror type sense amplifier of the present invention shown in FIG. 2 in comparison of that of the conventional current mirror type sense amplifier shown in FIG. 1.

DETAILED DESCRIPTION OF THE PRESENT INVENTION

Hereafter, the preferred embodiments of the present invention will be explained in detail referring to the attached diagrams.

Figure 2:
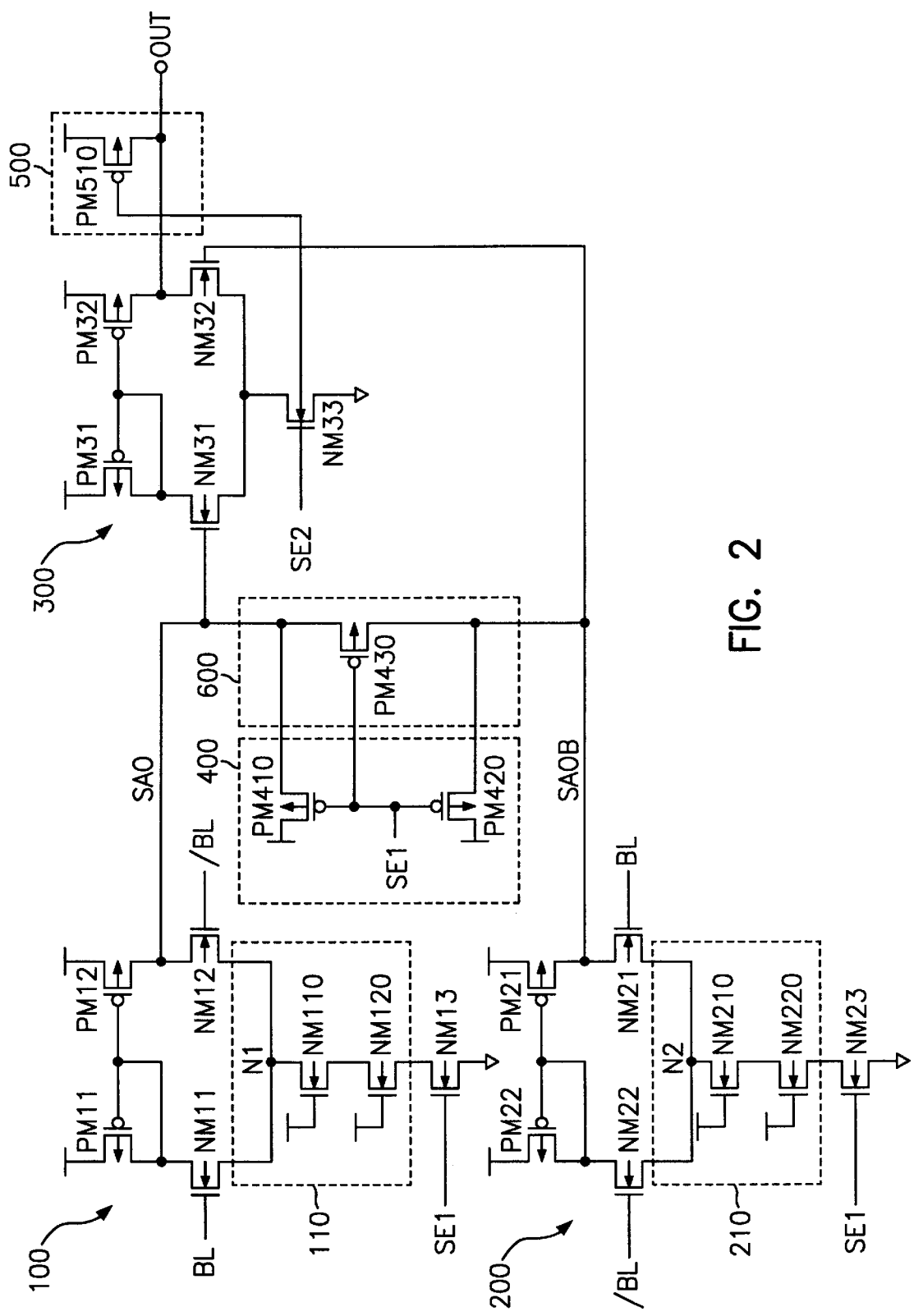
FIG. 2 is a circuit diagram of a current mirror type of sense amplifier according to one embodiment of the present invention.

FIG. 2 illustrates a current mirror type sense amplifier according to one embodiment of the present invention.

As shown in FIG. 2, the sense amplifier in accordance with one embodiment of the present invention comprises a first current mirror type sense amplifying unit 100, a second current mirror type sense amplifying unit 200, a third current mirror type sense amplifying unit 300, precharging units 400 and 500 and an equalizing unit 600. The precharging unit 400 and the equalizing unit 600 precharges and equalizes, respectively, the output nodes of the first and the second current mirror type sense amplifying units 100 and 200. The precharging unit 500 precharges the output node OUT of the third current mirror type sense amplifying unit 300.

Referring to FIG. 2, the first current mirror type sense amplifying unit 100 comprises NMOS transistors NM11 and NM12, PMOS transistors PM11 and PM12, an NMOS transistor NM13 and a first pull-down level elevating unit 110. The NMOS transistors NM11 and NM12 serve for sensing and amplifying and are applied with an input signal BL and an inverted input signal /BL, respectively, through their respective gates. The PMOS transistors PM11 and PM12 serve as a current mirror and are coupled between the power voltage and the drains of the NMOS transistors NM11 and NM12, respectively. The NMOS transistor NM13 is applied with a first sense enable signal SE1 through its gate and is coupled to the ground to serve as a current source. The first pull-down level elevating unit 110 is coupled between the node N1 and the ground to elevate the pull-down level of the pull-down node N1, in which the node N1 is commonly coupled to the sources of the NMOS transistors NM11 and NM12. The first current mirror type sense amplifying unit 100 produces its output signal SAO from the common drain of the NMOS transistor NM12 and the second PMOS transistor PM12. In addition, the first pull-down level elevating unit 110 is composed of a plurality of NMOS transistors NM110 and NM120 whose source-drain paths are coupled in series between the node N1 and the drain of the NMOS transistor NM13. Also, the NMOS transistors NM110 and NM120 are applied with the power voltage through their respective gates.

Similarly, the second current mirror type sense amplifying unit 200 comprises NMOS transistors NM22 and NM21, PMOS transistors PM22 and PM21, NMOS transistor NM23 and a second pull-down level elevating unit 210. The NMOS transistors NM22 and NM21 serve for sensing and amplifying and are applied with the inverted input signal /BL and the input signal BL, respectively, through their respective gates. The PMOS transistors PM22 and PM21 serve as a current mirror and are coupled between the power voltage and the drains of the NMOS transistors NM22 and NM21, respectively. The NMOS transistor NM23 is applied with the first sense enable signal SE1 through its gate and is coupled to the ground to serve as a current source. The second pull-down level elevating unit 210 is coupled between the node N2 and the ground to elevate the pull-down level of the node N2, in which the node N2 is commonly coupled to the sources of the NMOS transistors NM22 and NM21. The second current mirror type sense amplifying unit 200 produces its output signal SAOB from the common drain of the NMOS transistor NM21 and the fourth PMOS transistor PM21. In addition, the second pull-down level elevating unit 210 is composed of a plurality of NMOS transistors NM210 and NM220 whose source-drain paths are coupled in series between the node N2 and the drain of the NMOS transistor NM23. Also, the NMOS transistors NM210 and NM220 are applied with the power voltage through their respective gates.

Similarly, the third current mirror type sense amplifying unit 300 comprises NMOS transistors NM31 and NM32, PMOS transistors PM31 and PM32, and an NMOS transistor NM33. The NMOS transistors NM31 and NM32 serve for sensing and amplifying and are applied with the output signals SAO and SAOB of the first and the second current mirror type sense amplifying units 100 and 200, respectively, through their respective gates. The PMOS transistors PM31 and PM32 serve as a current mirror and are coupled between the power voltage and the drains of the NMOS transistors NM31 and NM32, respectively. The NMOS transistor NM33 is applied with a second sense enable signal SE2 through its gate and is coupled between the common source of the NMOS transistors NM31 and NM32 and the ground so as to serve as a current source. The third current mirror type sense amplifying unit 300 produces its output signal OUT from the common drain of the NMOS transistor NM32 and the sixth PMOS transistor PM32.

Next, the precharging unit 400 comprises PMOS transistors PM410 and PM420 and the equalizing unit 600 comprises a PMOS transistor PM430. In the PMOS transistor PM410, the source-drain path thereof is coupled between the power voltage and the output node of the first current mirror type sense amplifying unit 100 and the gate thereof is applied with the first sense enable signal SE1. For the PMOS transistor PM420, the source-drain path thereof is coupled between the power voltage and the output node of the second current mirror type sense amplifying unit 200 and the gate thereof is applied with the first sense enable signal SE1. The PMOS transistor PM430 whose source-drain path is coupled between the outputs of the first and the second current mirror type sense amplifying units 100 and 200 and whose gate is applied with the first sense enable signal SE1, is for equalizing the output nodes of the first and the second current mirror type sense amplifying units 100 and 200.

Next, the precharging unit 500 comprises a PMOS transistor PM510 whose source-drain path is coupled between the power voltage and the output node of the third current mirror type sense amplifying unit 300, and whose gate is applied with the second sense enable signal SE2 and which is for precharging the output node of the third current mirror type sense amplifying unit 300.

The operation of the current mirror type sense amplifier of the present invention having such structure as described above, will be in detail explained.

First, the NMOS transistors NM13, NM23 and NM33 for serving as current sources are turned off by the low state of the first and the second sense enable signals SE1 and SE2, so that the sensing and amplifying operation of the first to the third current mirror type sense amplifying units 100, 200 and 300 can not be performed. At this time, the first sense enable signal SE1 is applied to the gates of the PMOS transistors PM410 and PM420 of the precharging unit 400 and to the gate of the PMOS transistor PM430 of the equalizing unit 600, which are, in turn, turned on so as to precharge and equalize the output nodes of the first and the second current mirror type sense amplifying units 100 and 200 to the power voltage level.

Simultaneously, the second sense enable signal SE2 is applied to the gate of PMOS transistor PM510 of the precharging unit 500, which is turned on so as to precharge the output node of the third current mirror type sense amplifying unit 300 to the power voltage level.

Accordingly, in the current mirror type sense amplifier of the present invention, when the first to the third current mirror type sense amplifying units 100, 200 and 300 stop the sensing operation, the output nodes of the first to the third current mirror type sense amplifying units 100, 200 and 300 are precharged to the power voltage level by the precharging unit 400 and the precharging unit 500, so that any erroneous data sensing & amplifying due to noise may be prevented.

In the meantime, when the first sense enable signal SE1 is high state, the PMOS transistors PM410 and PM420 of the precharging unit 400 and the PMOS transistor PM430 of the equalizing unit 600 is turned off, so that the precharging and equalizing operation can not be performed. Also, the NMOS transistors NM13 and NM23 serving as current sources of the first and the second current mirror type sense amplifying units 100 and 200 are turned on by the high state of the first sense enable signal SE1, so as to perform the sensing and amplifying operation.

When the first sense enable signal SE1 is high state, all of the NMOS transistors NM110, NM120 and NM13 are turned on. At this time, the voltage level of the node N1 is higher than the ground by the voltage drops of the NMOS transistors NM110, NM120 and NM13. Similarly, the node N2 is higher than the ground by the voltage drops of the NMOS transistors NM210, NM220 and NM23, when the first sense enable signal SE1 is high state. Accordingly, the first and the second pull-down elevating units 110 and 210 elevate the pull-down levels of the nodes N1 and N2, respectively when the first sense enable SE1 is in high state, so that the gate-source voltage differences $V^{GS}$ of NMOS transistors NM11, NM12, NM22 and NM21 are reduced. Thus, the sensitivity of the differences between the input signal BL and the inverted input signal /BL is increased. Accordingly, when the input signal BL and the inverted input signal /BL are swung around the power voltage level, the levels of the pull-down nodes N1 and N2 are increased so that the gain of sensing & amplifying is increased.

Subsequently, when the second sense enable signal SE2 is high state, the precharging operation of the precharging unit 500 is stopped, and the third current mirror type sense amplifying unit 300 is activated so as to sense and amplify the difference between the output signals SAO and SAOB of the first and the second current mirror type sense amplifying units 100 and 200 and to finally produce an output signal OUT. Here, the second sense enable signal SE2 is activated in a predetermined time after the first sense enable signal SE1 is activated. The predetermined time (that is a delay time) is controlled by a delay unit which is composed of multiple-stage gates, for example 4 to 8 stages of inverters. So, the period between the rising edges of SE1 and SE2(that is a delay) is controlled by the number of the delay gates. Also, this delay may vary in accordance with the power supply voltage level, such that if the power supply voltage level is increased, the delay time is reduced, and if the power supply voltage level is reduced, the delay time is increased.

FIGS. 3A–3D illustrate the operation characteristics of the current mirror type sense amplifier of the present invention in comparison of that of the conventional current mirror type sense amplifier.

Referring to FIGS. 3A–3D, (a) represents the characteristic waveform of the first sense enable signal SE1, (b) represents the characteristic waveform of the input signal BL, (c) represents the characteristic waveform of the inverted input signal /BL, (d) represents the characteristic waveform of the output signal SAO of the first current mirror type sense amplifying unit 100 in accordance with the present invention, (e) represents the characteristic waveform of the output signal SAOB of the second current mirror type sense amplifying unit 200 in accordance with the present invention, (f) represents the characteristic waveform of the output signal OUT of the third current mirror type sense amplifying unit 300 in accordance with the present invention, (g) represents the characteristic waveform of the output signal of the first current mirror type sense amplifying unit 10 in accordance with the conventional sense amplifier, (h) represents the characteristic waveform of the output signal of the second current mirror type sense amplifying unit 20 in accordance with the conventional sense amplifier, and (i) represents the characteristic waveform of the output signal of the third current mirror type sense amplifying unit 30 in accordance with the conventional sense amplifier.

Figure 3B:
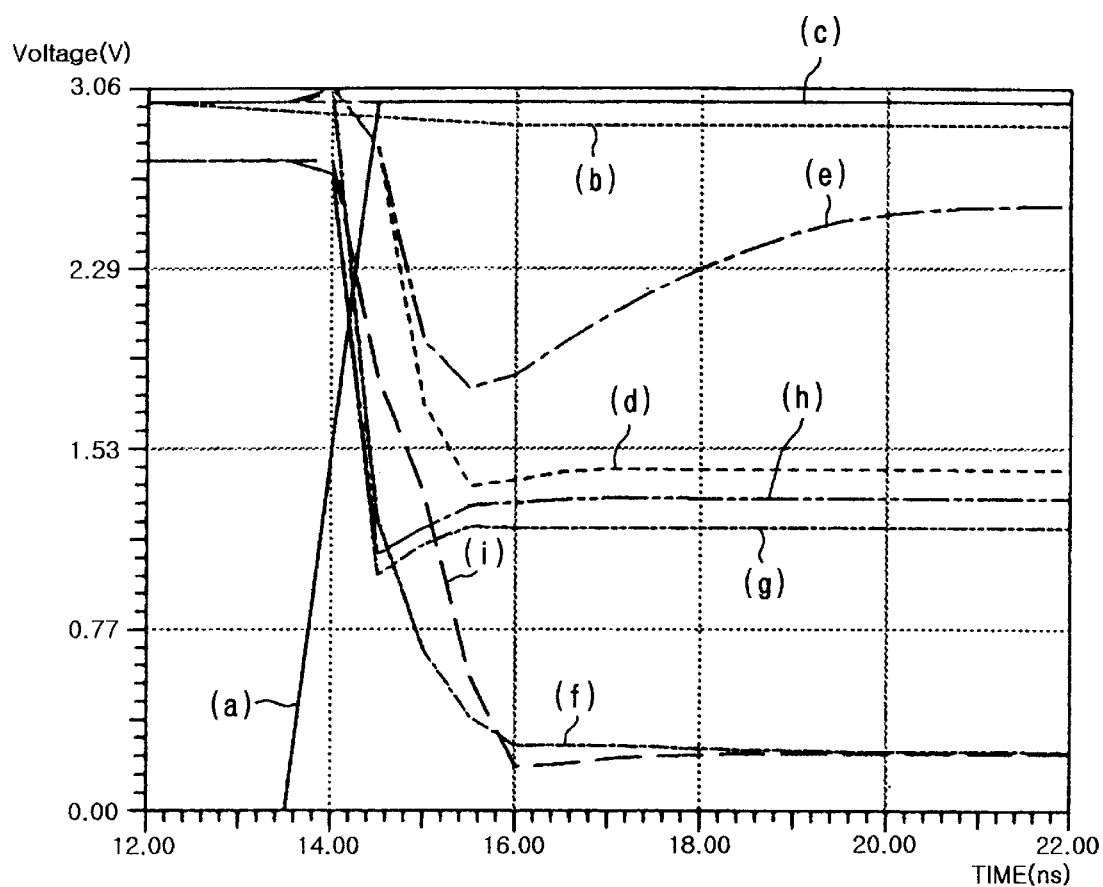
Figure 3C:
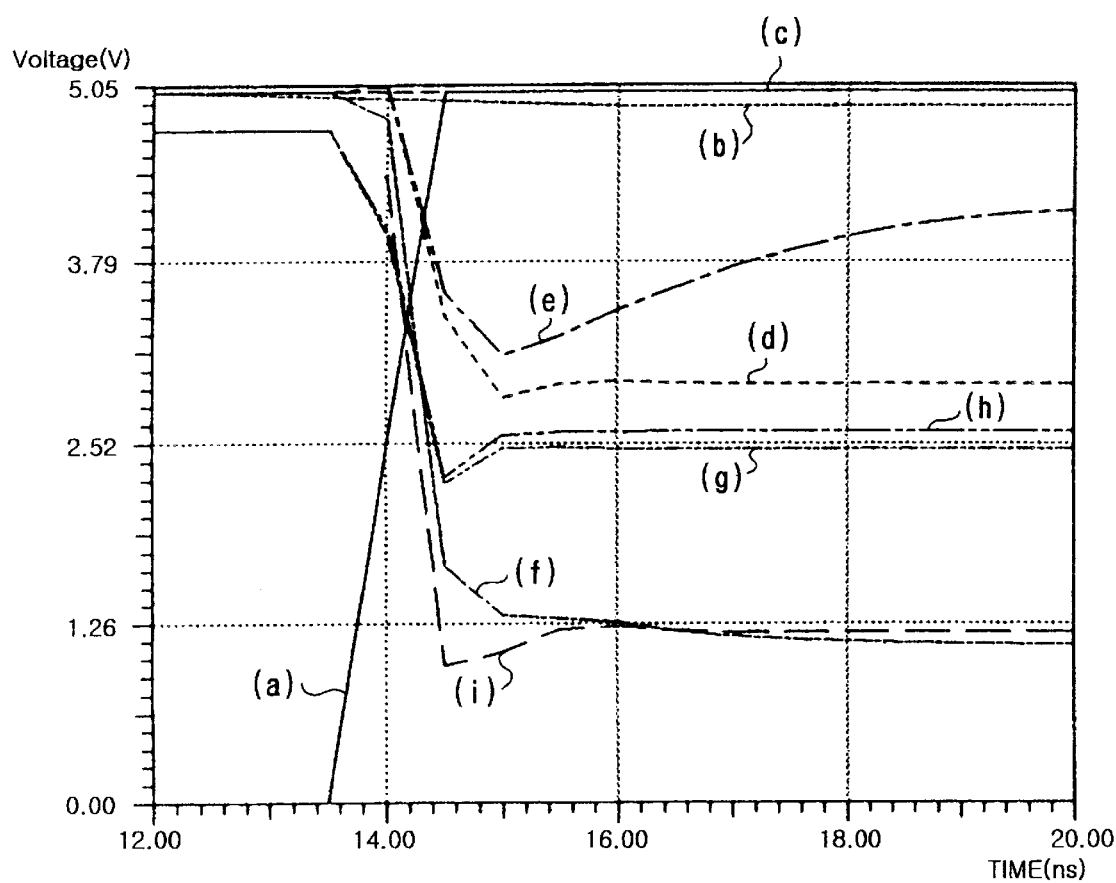
Figure 3D:
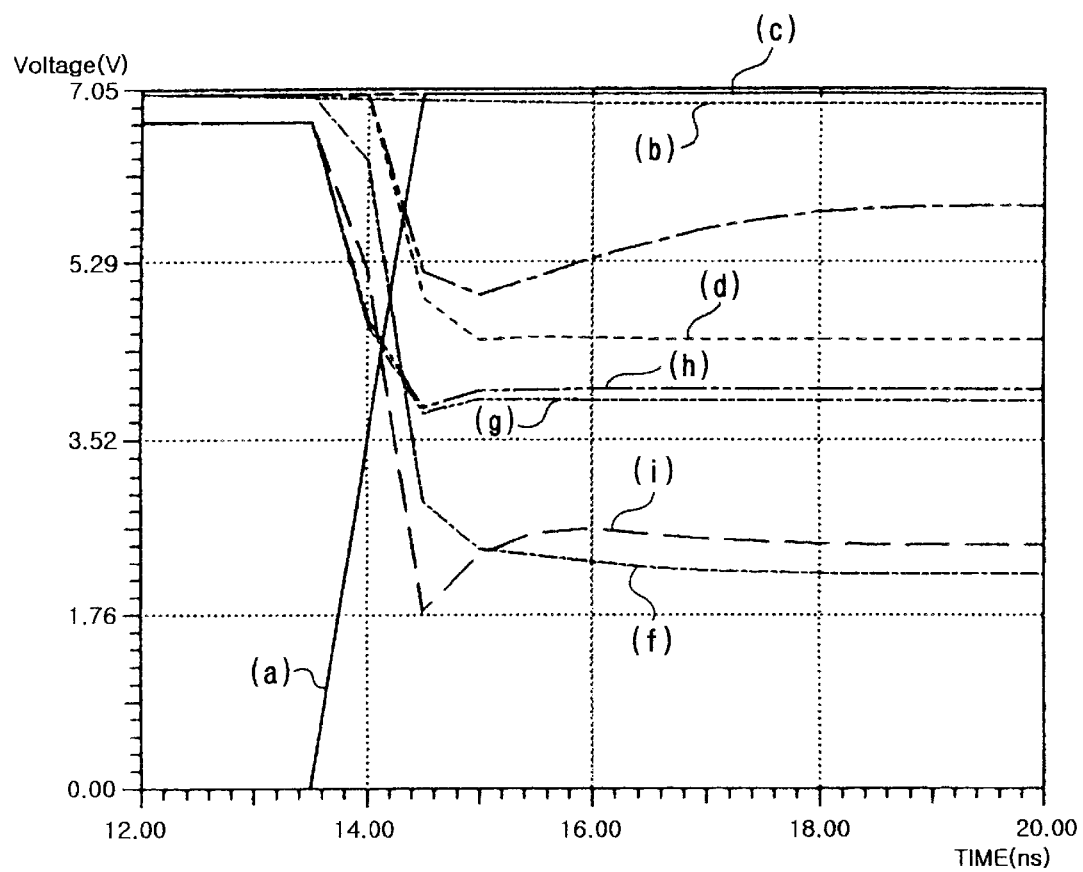

FIG. 3A illustrates the comparison between the operation characteristics of the current mirror type sense amplifiers in accordance with the present invention and that of the conventional sense amplifier, when the power voltage is 1 volt. FIG. 3B illustrates the comparison between the operation characteristics of the current mirror type sense amplifiers in accordance with the present invention and that of the conventional sense amplifier, when the power voltage is 3 volts. FIG. 3C illustrates the comparison between the operation characteristics of the current mirror type sense amplifiers in accordance with the present invention and that of the conventional sense amplifier, when the power voltage is 5 volts. FIG. 3D illustrates the comparison between the operation characteristics of the current mirror type sense amplifiers in accordance with the present invention and that of the conventional sense amplifier, when the power voltage is 7 volts.

As mentioned above, the current mirror type sense amplifier in accordance with the present invention has an effect that it precharges the output nodes of the first to the third current mirror type sense amplifying units before the sensing & amplifying operation, so as to prevent erroneous sensing & amplifying data due to noise. Also, the level of the pull-down nodes of the first the second current mirror type sense amplifying units in accordance with the present invention is elevated so as to reduce the voltage difference between gate-source of NMOS transistors for sensing & amplifying, which brings an effect that it can be operated in wide range from low power voltage to high power voltage.

Figure 1:
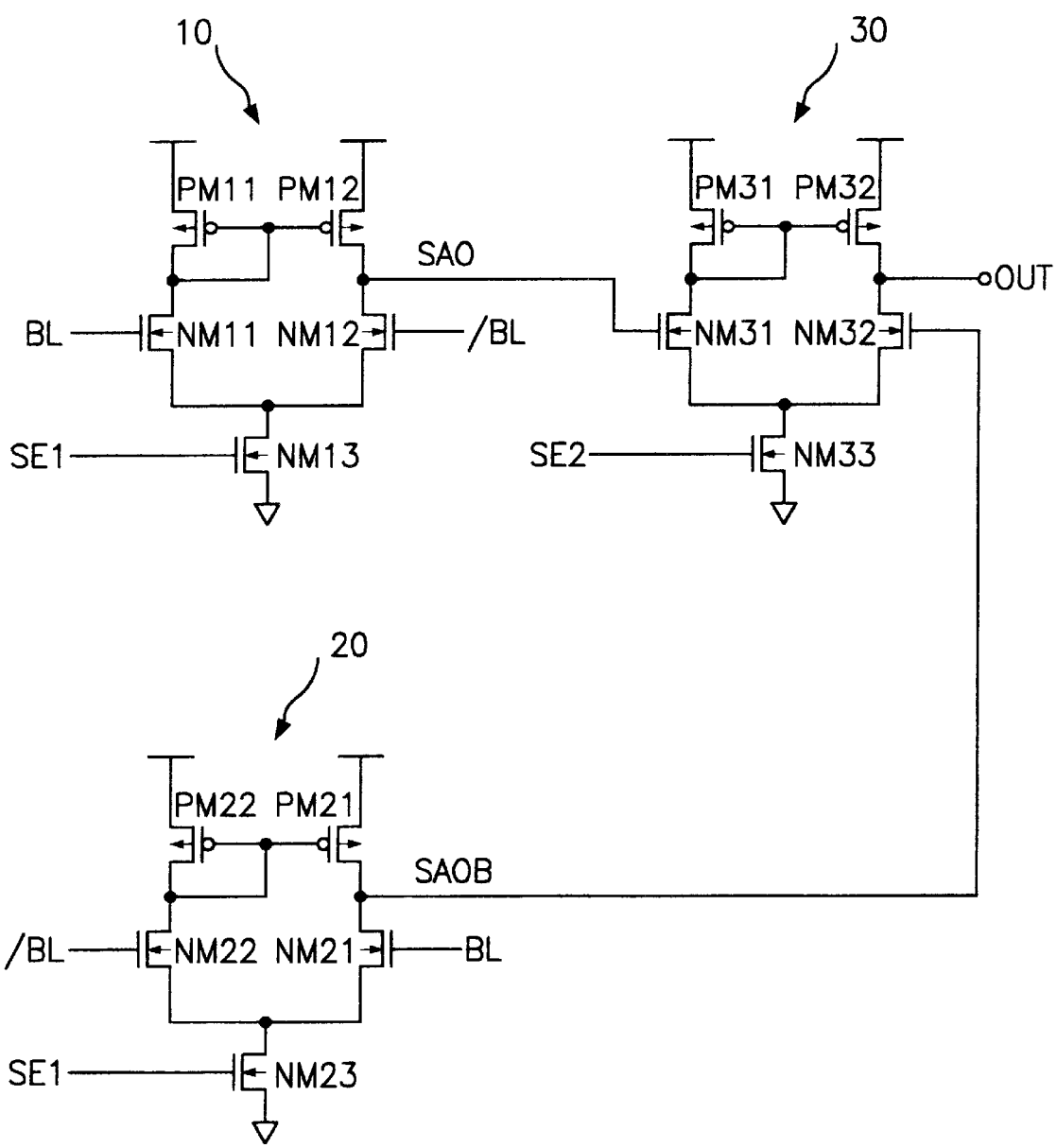
FIG. 1 is a circuit diagram of a conventional current mirror type of sense amplifier.

The following table illustrates the effect of the sense amplifier of FIG. 2 according to the present invention, in comparison with the sense amplifier shown in FIG. 1.

| | The power supply voltage | | | | | | | |
|---|---|---|---|---|---|---|---|---|
| | 1 [V] | | 3 [V] | | 5 [V] | | 7 [V] | |
| | FIG. 1 | FIG. 2 | FIG. 1 | FIG. 2 | FIG. 1 | FIG. 2 | FIG. 1 | FIG. 2 |
| $\Delta V_{bit\ lines}$ | 100 mV | | 100 mV | | 100 mV | | 100 mV | |
| $\Delta V_{SA}$ | 1 [V] | 1 [V] | 0.1 [V] | 1.2 [V] | 0.1 [V] | 1.3 [V] | 0.1 [V] | 1.3 [V] |
| GAIN | 10 | 10 | 1 | 12 | 1 | 13 | 1 | 13 |

In above table, $\Delta V_{bit\ lines}$ represents the voltage difference between the bit line BL and the inverted bit line, $\Delta V_{SA}$ represents the voltage difference between the output signal SAO of the first current mirror type sense amplifying unit 10 or 100 and the output signal SAOB of the second current mirror type sense amplifying unit 20 or 200.

As shown in the above table, the gain characteristic of the sense amplifier according to the present invention is improved.

Although preferred embodiments of the present invention has been illustrated and described, various alternatives, modifications and equivalents may be used. Therefore, the foregoing description should not be taken as limiting the scope of the present invention which is defined by the appended claims.

What is claimed is:

1. A current mirror type sense amplifier, comprising:
    a first current mirror type sense amplifying unit for primarily sensing and amplifying a voltage difference between an input signal and an inverted input signal, in response to a first sense enable signal, wherein said first current mirror type sense amplifying unit has a pull-down level elevating unit for elevating a level of a pull-down node, said pull-down level elevating unit including a plurality of NMOS transistors, whose drain-source paths are coupled in series between the pull-down node and a ground and whose gates are applied with a power voltage;
    a second current mirror type sense amplifying unit for primarily sensing and amplifying the voltage difference between the inverted input signal and the input signal, in response to the first sense enable signal;
    a third current mirror type sense amplifying unit for sensing and amplifying a voltage difference between output signals of said first and said second current mirror type sense amplifying units in response to a second sense enable signal, said second sense enable signal being activated in a predetermined time after said first sense enable signal is activated;
    a first precharging unit for precharging output nodes of said first and said second current mirror type sense amplifying units in response to the first sense enable signal;
    an equalizing unit for equalizing the output nodes of said first and said second current mirror type sense amplifying units in response to the first sense enable signal; and
    a second precharging unit for precharging an output node of said third current mirror type sense amplifying unit, in response to the second sense enable signal.

2. A current mirror type sense amplifier according to claim 1, wherein said first precharging unit comprises:
    a first PMOS transistor whose source-drain path is coupled between the power voltage and the output node of said first current mirror type sense amplifying unit and whose gate is applied with the first sense enable signal, for precharging the output node of said first current mirror type sense amplifying unit; and
    a second PMOS transistor whose source-drain path is coupled between the power voltage and the output node of said second current mirror type sense amplifying unit and whose gate is applied with the first sense enable signal, for precharging the output node of said second current mirror type sense amplifying unit.

3. A current mirror type sense amplifier according to claim 2, wherein said equalizing unit comprises:
    a third PMOS transistor whose source-drain path is coupled between the output nodes of said first and said second current mirror type sense amplifying units and whose gate is applied with the first sense enable signal, for equalizing the output nodes of said first and said second current mirror type sense amplifying units.

4. A current mirror type sense amplifier according to claim 1, wherein said second precharging unit comprises:
    a PMOS transistor whose source-drain path is coupled between the power voltage and an output node of said third current mirror type sense amplifying unit and whose gate is applied with the second sense enable signal, for precharging the output node of said third current mirror type sense amplifying unit.

5. A current mirror type sense amplifier according to claim 1, wherein said first and said second precharging units precharge the output nodes of said first, said second and said third current mirror type sense amplifying units to a level of the power voltage.

6. A current mirror type sense amplifier according to claim 1, wherein said first current mirror type sense amplifying unit further comprises:
    first and second NMOS transistors whose gates are applied with the input signal and the inverted input signal respectively;
    first and second PMOS transistors whose source-drain paths are coupled between the drains of said first and said second NMOS transistors and the power voltage respectively and for serving as a current mirror;
    third NMOS transistor being coupled to a ground and having a gate applied with the first sense enable signal for serving as a current source; and
    the plurality of NMOS transistors within the pull-down level elevating unit includes fourth and fifth NMOS transistors whose drain-source paths are coupled between a common source of said first and said second NMOS transistors and the drain of said third NMOS transistor, respectively, and whose gates are applied with the power voltage, wherein the common source is the pull-down node.

7. A current mirror type sense amplifier according to claim 1, wherein said second current mirror type sense amplifying unit further comprises:
    first and second NMOS transistors whose gates are applied with the input signal and the inverted input signal, respectively;
    first and second PMOS transistors whose source-drain paths are coupled between the drains of said first and said second NMOS transistors and the power voltage, respectively, for serving as a current mirror;

third NMOS transistor being coupled to a ground and having a gate applied with the first sense enable signal for serving as a current source; and fourth and fifth NMOS transistors whose drain-source paths are coupled between a common source of said first and said second NMOS transistors and the drain of said third NMOS transistor respectively and whose gates are applied with the power voltage.

8. A current mirror type sense amplifier, comprising:

a first current mirror type sense amplifying unit for primarily sensing and amplifying a voltage difference between an input signal and an inverted input signal, in response to a first sense enable signal;

a second current mirror type sense amplifying unit for primarily sensing and amplifying the voltage difference between the inverted input signal and the input signal, in response to the first sense enable signal, wherein said second current mirror type sense amplifying unit has a pull-down level elevating unit for elevating a level of a pull-down node, said pull-down level elevating unit including a plurality of NMOS transistors, whose drain-source paths are coupled in series between the pull-down node and a ground and whose gates are applied with a power voltage;

a third current mirror type sense amplifying unit for sensing and amplifying a voltage difference between output signals of said first and said second current mirror type sense amplifying units in response to a second sense enable signal, said second sense enable signal being activated in a predetermined time after said first sense enable signal is activated;

a first precharging unit for precharging output nodes of said first and said second current mirror type sense amplifying units in response to the first sense enable signal;

an equalizing unit for equalizing the output nodes of said first and said second current mirror type sense amplifying units in response to the first sense enable signal; and a second precharging unit for precharging an output node of said third current mirror type sense amplifying unit, in response to the second sense enable signal.

9. A current mirror type sense amplifier according to claim 8, wherein said first precharging unit comprises:

a first PMOS transistor whose source-drain path is coupled between the power voltage and the output node of said first current type sense amplifying unit and whose gate is applied with the first sense enable signal, for precharging the output node of said first current mirror type sense amplifying unit; and a second PMOS transistor whose source-drain path is coupled between the power voltage and the output node of said second current mirror type sense amplifying unit and whose gate is applied with the first sense enable signal, for precharging the output node of said second current mirror type sense amplifying unit.

10. A current mirror type sense amplifier according to claim 9, wherein said equalizing unit comprises:

a third PMOS transistor whose source-drain path is coupled between the output nodes of said first and said second current mirror type sense amplifying units and whose gate is applied with the first sense enable signal, for equalizing the output nodes of said first and said second current mirror type sense amplifying units.

11. A current mirror type sense amplifier according to claim 8, wherein said second precharging unit comprises:

a PMOS transistor whose source-drain path is coupled between the power voltage and an output node of said third current mirror type sense amplifying unit and whose gate is applied with the second sense enable signal.

12. A current mirror type sense amplifier according to claim 8, wherein said first and said second precharging units precharge the output nodes of said first, said second and said third current mirror type sense amplifying units to a level of the power voltage.

13. A current mirror type sense amplifying according to claim 8, wherein said second current mirror type sense amplifying unit further comprises:

first and second NMOS transistors whose gates are applied with the input signal and the inverted input signal, respectively;

first and second PMOS transistors whose source-drain paths are coupled between the drains of said first and said second NMOS transistors and the power voltage, respectively, for serving as current mirror;

third NMOS transistor being coupled to a ground and having a gate applied with the first sense enable signal for serving as a current source; and the plurality of NMOS transistors within the pull-down level elevating unit includes fourth and fifth NMOS transistors whose drain-source paths are coupled between a common source of said first and said second NMOS transistors and the drain of said third NMOS transistor respectively and whose gates are applied with the power voltage, wherein the common source is the pull-down node.

* * * * *